(12) United States Patent
Dasgupta

(10) Patent No.: US 7,973,605 B2
(45) Date of Patent: Jul. 5, 2011

(54) THREE-STAGE FREQUENCY-COMPENSATED OPERATIONAL AMPLIFIER FOR DRIVING LARGE CAPACITIVE LOADS

(75) Inventor: Uday Dasgupta, Singapore (SG)

(73) Assignee: MediaTek Singapore Pte. Ltd., Singapore (SG)

( * ) Notice: Subject to any disclaimer, the term of this patent is extended or adjusted under 35 U.S.C. 154(b) by 189 days.

(21) Appl. No.: 12/486,759

(22) Filed: Jun. 18, 2009

(65) Prior Publication Data

US 2010/0066449 A1  Mar. 18, 2010

Related U.S. Application Data

(60) Provisional application No. 61/097,202, filed on Sep. 15, 2008.

(51) Int. Cl.
*H03F 1/14* (2006.01)
(52) U.S. Cl. .......................... 330/292; 330/260
(58) Field of Classification Search .................. 330/53, 330/76, 255, 260, 292
See application file for complete search history.

(56) References Cited

U.S. PATENT DOCUMENTS 4,559,502 A * 12/1985 Hiujsing ................. 330/260
6,801,087 B2 * 10/2004 Ausserlechner ......... 330/260
7,348,851 B2 *  3/2008 Chen et al. .............. 330/292

OTHER PUBLICATIONS

Ahuja, IEEE Journal of Solid-State Circuits, vol. SC-18, No. 6, Dec. 1983.
Leung et al., IEEE Transactions on Solid-State Circuits, vol. 35, No. 2, Feb. 2000.
Hoi Lee et al., IEEE Journal of Solid-State Circuits, vol. 38, No. 3, Mar. 2003.
Peng et al., IEEE Journal of Solid-State Circuits, vol. 39, No. 11, Nov. 2004.
Fan et al., IEEE Journal of Solid-State Circuits, vol. 40, No. 3, Mar. 2005.
Dhanasekaran et al., 2008 IEEE International Solid-State Conference Session 24/Analog Power Techniques/24.1.
OP'T Eynde et al., IEEE Journal of Solid-State Circuits, vol. 25, No. 1, Feb. 1990.

* cited by examiner

*Primary Examiner* — Khanh V Nguyen
(74) *Attorney, Agent, or Firm* — Winston Hsu; Scott Margo

(57) ABSTRACT

A three-stage frequency-compensated operational amplifier includes a first-stage circuit, a second-stage circuit incorporated with a first compensation circuit, a third-stage circuit, and a second compensation circuit. The three-stage frequency-compensated operational amplifier functions as a two-stage operational amplifier at high frequencies, thereby capable of driving large capacitive loads with low power consumption.

20 Claims, 9 Drawing Sheets

THREE-STAGE FREQUENCY-COMPENSATED OPERATIONAL AMPLIFIER FOR DRIVING LARGE CAPACITIVE LOADS

CROSS REFERENCE TO RELATED APPLICATIONS

This application claims the benefit of U.S. Provisional Application No. 61/097,202, filed on Sep. 15, 2008 and entitled "Ahuja Frequency Compensation for 3-stage Operational Amplifiers", the contents of which are incorporated herein by reference.

BACKGROUND OF THE INVENTION

1. Field of the Invention

The present invention relates to an operational amplifier, and more particularly, to an operational amplifier capable of driving large capacitive loads with low power consumption.

2. Description of the Prior Art

Operational amplifiers have been applied extensively in the field of electrical devices and electronics, such as inverter amplifiers, integrators, and filter circuits, to name just a few instances. With the rapid scaling in CMOS processes, supply voltages in VLSL have been dramatically reduced in recent years. Acting as a fundamental block in most analog systems, operational amplifiers are required to achieve high gain and large bandwidth simultaneously in low-voltage applications. Since conventional cascade amplifiers, which increase the gain by stacking up transistors, are not suitable in low-voltage design due to small voltage swings, more circuit designers are aware of the importance of multi-stage amplifiers, which boost the gain by increasing the number of gain stages horizontally. However, all multi-stage amplifiers suffer close-loop stability problems due to their multiple-pole nature in the small-signal transfer functions. Therefore, many frequency compensation topologies have been proposed to ensure the stability of the multi-stage amplifiers. Generally, the operational amplifier applied in the conventional driver chip is normally a two-stage amplifier having a first stage amplifying circuit for gain enhancement and a second stage output circuit for driving the capacitive or resistive load. However, three-stage operational amplifiers are also gaining popularity.

The most relevant characteristics of an amplifier circuit are usually gain and bandwidth. There is an inverse relationship between the gain and the bandwidth of amplifiers. In general, higher gain values are associated with lower bandwidths, and lower gain values are associated with higher bandwidth. The performance of an operational amplifier is characterized by its transfer function which can be obtained by applying small-signal analysis. Reference is made to FIG. 1 for a transfer function of an exemplary two-stage amplifier. There is a relatively constant gain from DC to a frequency of the first dominant pole $\omega_{P1}$. When the frequency rises above $\omega_{P1}$, the gain begins to fall sharply. The maximum available bandwidth is related to the second non-dominant pole $\omega_{P2}$. It may be desirable to adjust the frequency of poles $\omega_{P1}$ and $\omega_{P2}$ for different applications. Various compensation techniques, such as Miller compensation or Ahuja compensation, are known for adjusting the frequency of the poles of the amplifier. Miller compensation employs a feedback capacitor connected across an input and output of the second amplifier stage. In Ahuja compensation, a current gain device is added in a feedback loop of the second amplifier stage.

Reference is made to FIG. 2 for a block diagram of a prior art two-stage Miller Compensation (MC) amplifier 10. The two-stage MC amplifier 10 includes a first-stage amplifier 11, a second-stage amplifier 12, and a compensation capacitor $C_m$. The transconductance, output resistance, and lumped output parasitic resistance of the first gain stage are notated by $g_{m1}$, $r_{o1}$, and $C_{p1}$, and those of the second gain stage are notated by $g_{m2}$, $r_{o2}$, and $C_L$. The compensation capacitor $C_m$ is coupled between the input and the output ends of the second-stage amplifier 12. By introducing the compensation capacitor $C_m$, the capacitance of the second-stage amplifier 12 appears much larger from its input, thereby shifting the first dominant pole $\omega_{P1}$ to a lower frequency and the second non-dominant pole $\omega_{P2}$ to a higher frequency.

However, the capacitor $C_m$ functions as a short-circuited path at high frequencies, and the combination of the capacitor $C_m$ and the second-stage amplifier 12 creates a diode-connected transistor. In this case, any noise from a reference potential is transferred to the second-stage amplifier 12. In addition, the MC amplifier 100 has a poor power supply rejection ratio (PSRR) during high frequency operations. Therefore, if a good PSRR is required, the two-stage MC amplifier 10 is insufficient for desirable operation.

Reference is made to FIG. 3 for a block diagram of a prior art three-stage Nested Miller Compensation (NMC) amplifier 20. The three-stage NMC amplifier 20 includes a first-stage amplifier 21, a second-stage amplifier 22, a third-stage amplifier 23, and compensation capacitors $C_{m1}$ and $C_{m2}$. The transconductance, output resistance, and lumped output parasitic resistance of the first gain stage are notated by $g_{m1}$, $r_{o1}$ and $C_{p1}$, those of the second gain stage are notated by $g_{m2}$, $r_{o2}$, and $C_{p2}$, and those of the third gain stage are notated by $g_{m3}$, $r_{o3}$, and $C_L$. The compensation capacitor $C_{m1}$ is coupled between the input end of the second-stage amplifier 22 and the output end of the third-stage amplifier 23. The compensation capacitor $C_{m2}$ is coupled between the input end and the output end of the third-stage amplifier 23. Under the assumptions: (1) $C_{m1}$, $C_{m2}$ and $C_L \gg C_{P1}$ and $C_{P2}$ and (2) $g_{m3} \gg g_{m1}$ and $g_{m2}$, the three-stage NMC amplifier 20 is characterized by the small-signal transfer function $A_{NMC}(s)$ represented by:

$$A_{NMC}(s) = A_{DC} \frac{A_{DC}}{\left[\frac{s}{\omega_{p1}} + 1\right]\left[s^2 \frac{C_{m2}C_L}{g_{m2}g_{m3}} + s\frac{C_{m2}}{g_{m2}} + 1\right]} \quad (1)$$

where $A_{DC}$ is the DC gain equal to $g_{m1}g_{m2}g_{m3}r_{o1}r_{o2}r_{o3}$ and $\omega_{P1}$ is the dominant pole equal to $(C_{m1}g_{m2}g_{m3}r_{o1}r_{o2}r_{o3})^{-1}$ To stabilize the NMC amplifier 20, following dimension condition shall be obeyed:

$$C_{m1} = 4\left(\frac{g_{m1}}{g_{m3}}\right)C_L \quad (2)$$

$$C_{m2} = 2\left(\frac{g_{m2}}{g_{m3}}\right)C_L \quad (3)$$

Pole-splitting can also be achieved in the NMC amplifier 20 by introducing the compensation capacitors $C_{m1}$ and $C_{m2}$. However, the non-dominant pole depends on $C_{m2}$ and thus depends on the loading capacitance $C_L$, as depicted in (1) and (3). When driving a large capacitive load, a large $C_{m2}$ is required, thereby shifting the non-dominant pole to a rather low frequency. Therefore, the bandwidth of the NMC amplifier 20 is poor. Moreover, the NMC amplifier 20 is not suitable for low-power design since the previously stated assumption $g_{m3} \gg g_{m1}$ and $g_{m2}$ may not be valid.

Ahuja frequency compensation scheme is another well-known frequency compensation for operational amplifiers. Reference is made to FIG. 4 for a block diagram of a prior art two-stage Ahuja compensation amplifier 30. The two-stage Ahuja compensation amplifier 30 includes a first-stage amplifier 31, a second-stage amplifier 32, a compensation capacitor $C_m$, and a current gain device $I_g$. The transconductance, output resistance, and lumped output parasitic resistance of the first gain stage are notated by $g_{m1}$, $r_{o1}$, and $C_{p1}$, and those of the second gain stage are notated by $g_{m2}$, $r_{o2}$, and $C_L$. The two-stage Ahuja compensation amplifier 30 is characterized by the small-signal transfer function $A_{ahuja}(S)$ represented by $$A_{ahuja}(s) = A_{DC} \frac{\left[\frac{s}{\omega_z} + 1\right]}{\left[\frac{s}{\omega_{p1}} + 1\right]\left[\frac{s^2}{\omega_n^2} + \frac{s}{\left[\frac{\omega_n}{2\zeta}\right]} + 1\right]}$$

where
$A_{DC}$ is the DC gain equal to $g_{m1}g_{m2}r_{o1}r_{o2}$
$\omega_{P1}$ is the dominant pole equal to $(C_m g_{m2} r_{o1} r_{o2})^{-1}$
$\omega_z$ is the non-dominant zero equal to $$\frac{g_{mc}}{C_m}$$

$\zeta$ is the damping factor equal to $$\frac{1}{2}\sqrt{\frac{C_1 g_{mc}}{C_L g_{m2}}}\left[1 + \frac{C_L}{C_m}\right] \quad (4)$$

$\omega_n$ is the natural frequency equal to $$\sqrt{\frac{g_{mc} g_{m2}}{C_1 C_L}} \quad (5)$$

In the two-stage Ahuja compensation amplifier 30, the compensation capacitor $C_m$ and the current gain device $I_g$ are coupled in series between the input and the output ends of the second-stage amplifier 32. By introducing the current gain device $I_g$, the second-stage amplifier 32 no longer becomes a diode-connected transistor while it is operating at high frequencies. This two-stage Ahuja compensation amplifier 30 can thus achieve a good PSRR at high frequencies. However, the two-stage Ahuja compensation amplifier 30 fails to achieve good compensation in certain cases.

SUMMARY OF THE INVENTION

One embodiment of the present invention provides a three-stage frequency-compensated operational amplifier for driving large capacitive loads and comprising a first-stage circuit, a second-stage circuit, a third-stage circuit, and a second compensation circuit. The first compensation circuit, for generating a first output signal by amplifying an input signal, includes an input end for receiving the input signal an output end for outputting the first output signal. The second-stage circuit, for generating a second output signal by selectively amplifying the first output signal with a first gain while the first output signal is at a first frequency and amplifying the first output signal with a second gain while the first output signal is at a second frequency, includes an input end coupled to the output end of the first-stage circuit for receiving the first output signal, an output end for outputting the second output signal, and a first compensation circuit for modifying the first gain to the second gain at the second frequency. The third-stage circuit, for generating a third output signal by amplifying the second output signal, includes an input end for receiving the second output signal and an output end for outputting the third output signal. The second compensation circuit for adjusting frequency characteristics of the second and third-stage circuits comprises a first compensation capacitor coupled to the output end of the third-stage circuit and a current source coupled between the compensation capacitor and the input end of the second-stage circuit.

Another embodiment of the present invention further provides a three-stage frequency-compensated operational amplifier for driving large capacitive loads, comprising a first-stage circuit for generating a first output signal by amplifying an input signal, comprising: an input end for receiving the input signal; a low impedance end; and an output end for outputting the first output signal; a second-stage circuit for generating a second output signal by selectively amplifying the first output signal with a first gain while the first output signal is at a first frequency and amplifying the first output signal with a second gain while the first output signal is at a second frequency, comprising an input end coupled to the output end of the first-stage circuit for receiving the first output signal; an output end for outputting the second output signal; and a first compensation circuit for modifying the first gain to the second gain at the second frequency; a third-stage circuit for generating a third output signal by amplifying the second output signal, comprising an input end for receiving the second output signal; and an output end for outputting the third output signal; and a first compensation capacitor coupled between the low impedance end of the first-stage circuit and the output end of the third-stage circuit for adjusting frequency characteristics of the second and third-stage circuits.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
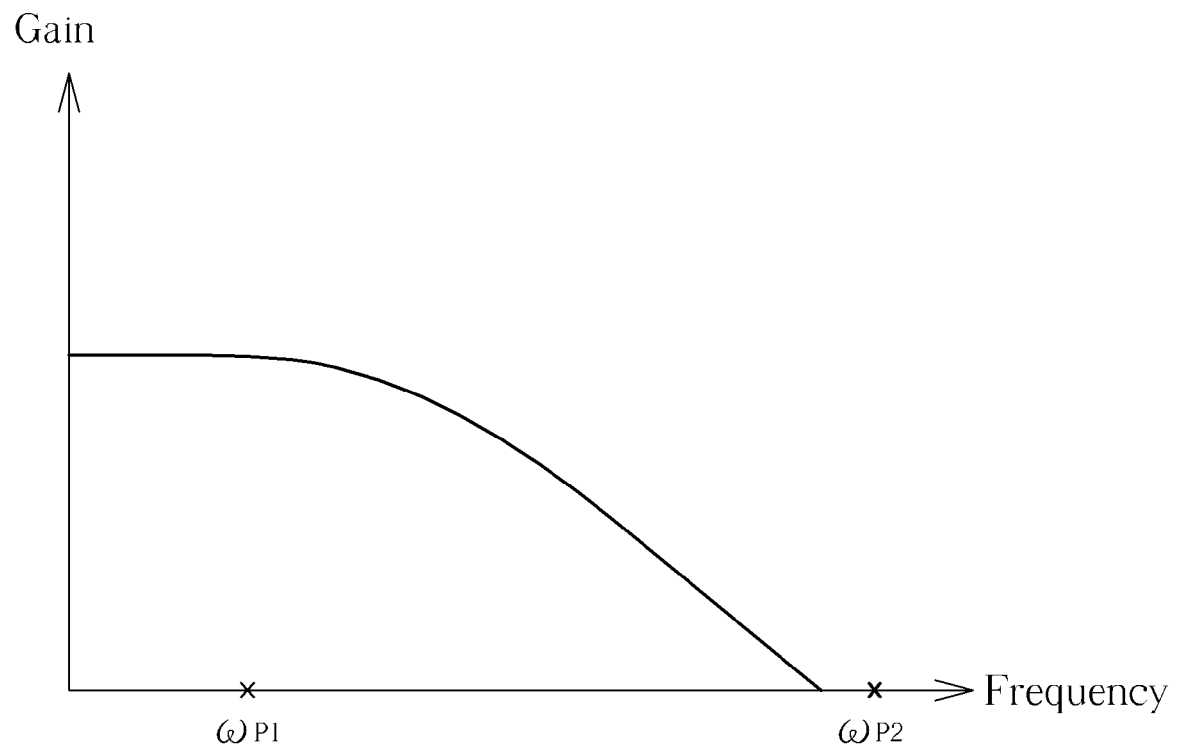
FIG. 1 is a transfer function of an exemplary two-stage amplifier.
Figure 2:
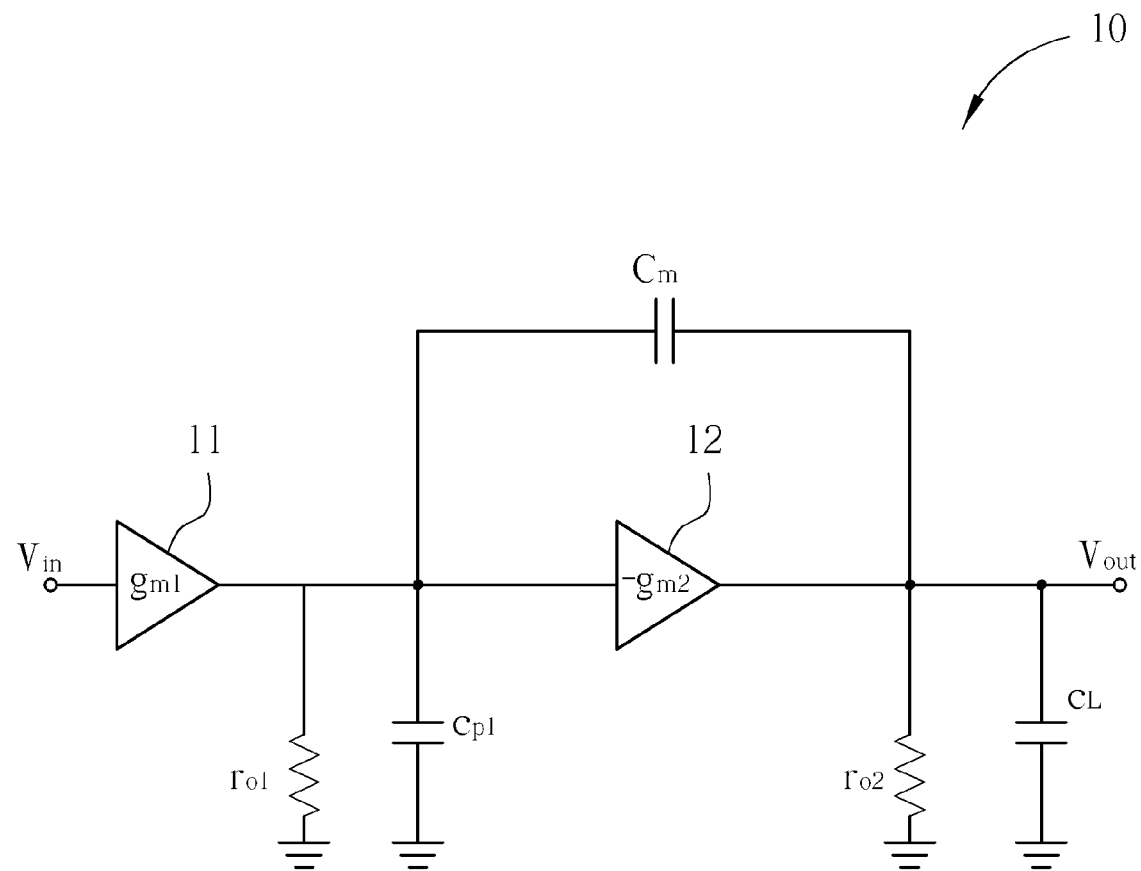
FIG. 2 is a block diagram of a prior art two-stage Miller Compensation amplifier.
Figure 3:
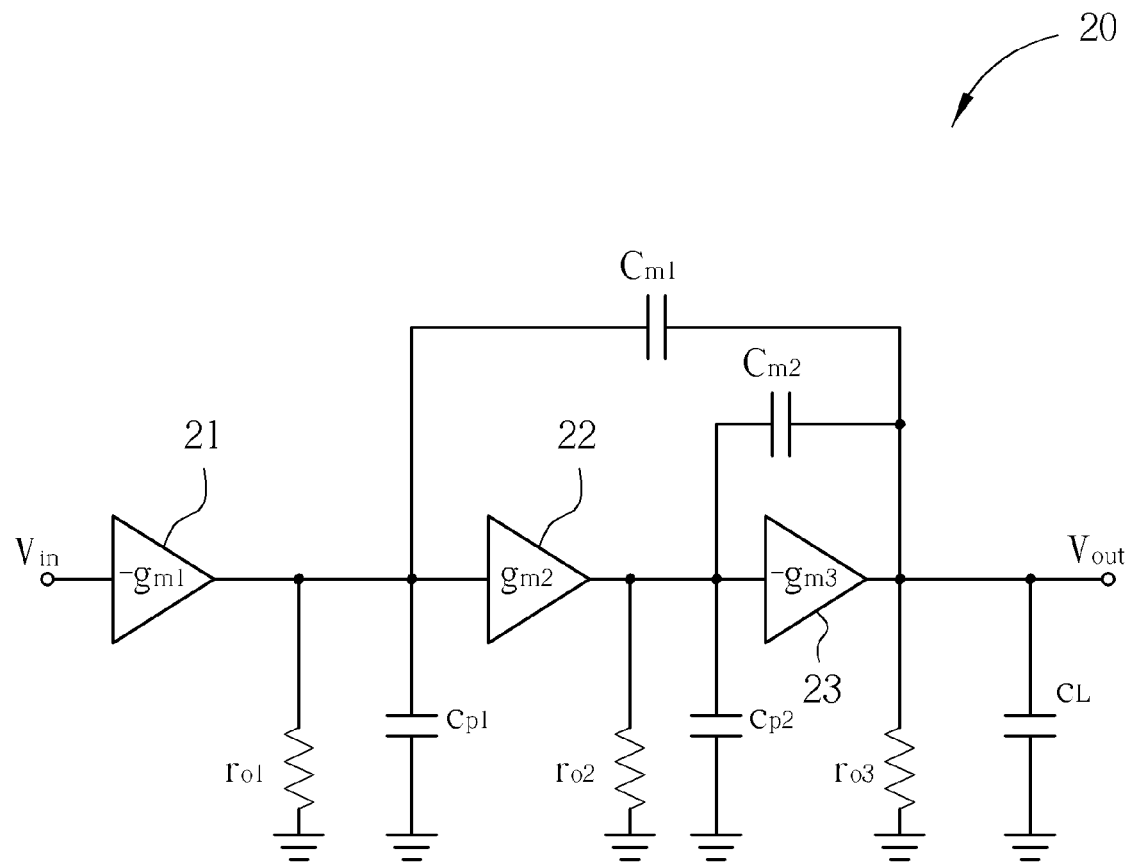
FIG. 3 is a block diagram of a prior art three-stage Nested Miller Compensation amplifier.
Figure 4:
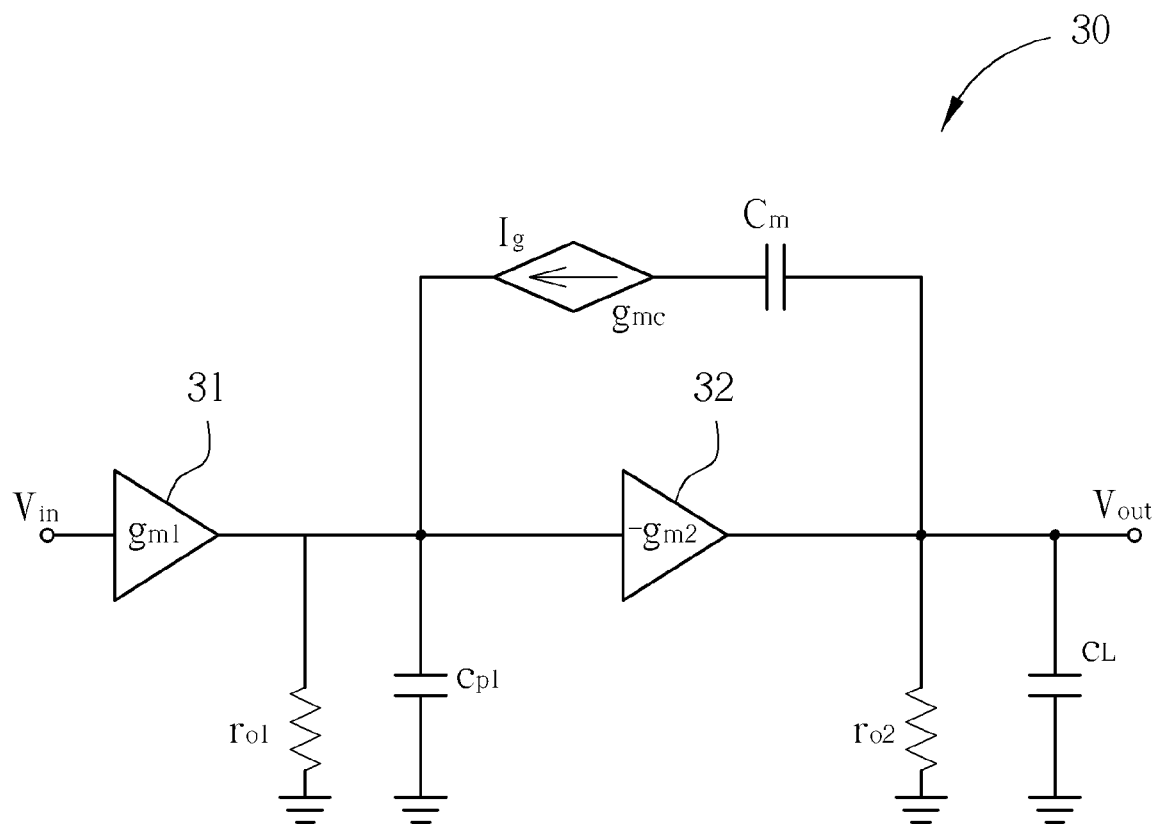
FIG. 4 is a block diagram of a prior art two-stage Ahuja compensation amplifier.
Figure 5:
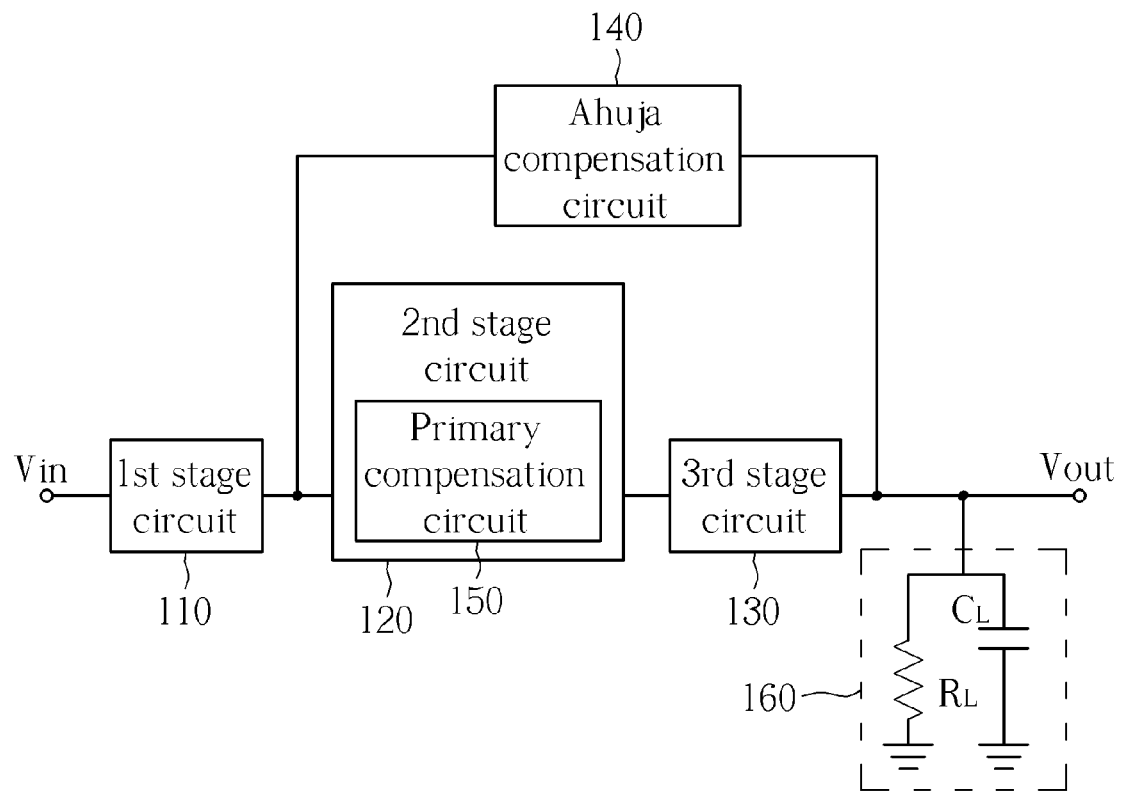
FIG. 5 is a block diagram of a three-stage operational amplifier according to one embodiment of the present invention.

Reference is made to FIG. 5 for a block diagram of a three-stage operational amplifier according to one embodiment of the present invention. The operational amplifier depicted in FIG. 5 includes a first stage circuit 110, a second stage circuit 120, a third stage circuit 130, an Ahuja compensation circuit 140, and a primary compensation circuit 150. The Ahuja compensation circuit 140 is coupled between the input end of the second stage circuit 120 and the output of the third stage circuit 130. The primary compensation circuit 150 is incorporated with the second stage circuit 120. The operational amplifier in FIG. 5 can generate an output signal $V_{out}$ by enhancing an input signal $V_{in}$ with a DC gain $A_{DC}$ in order to drive an external load 160 represented by a capacitor $C_L$ and a resistor $R_L$.

Figure 6:
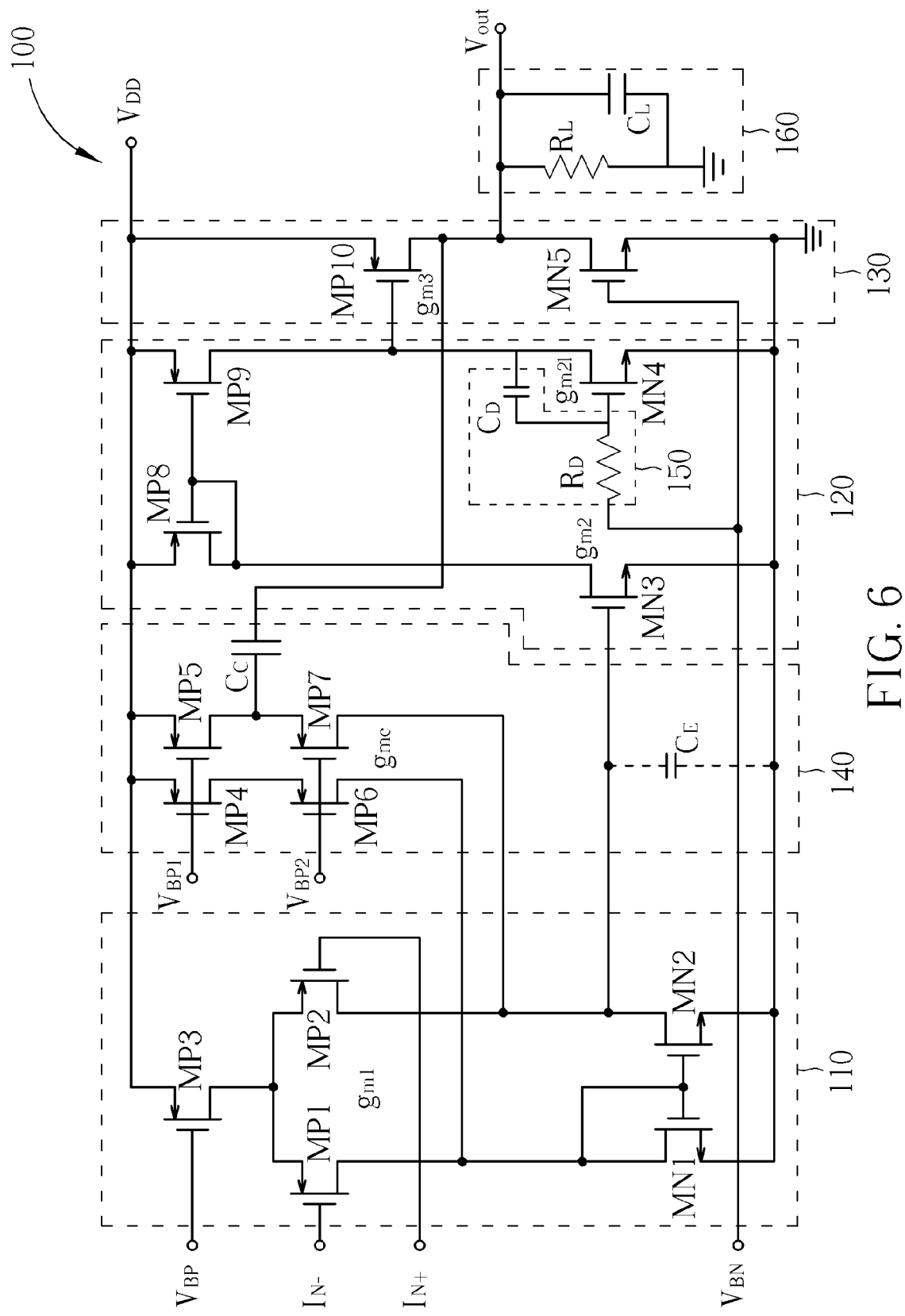
FIG. 6 is a diagram of a three-stage operational amplifier according to a first embodiment of the present invention.

Reference is made to FIG. 6 for a diagram of a three-stage operational amplifier 100 according to a first embodiment of the present invention. In the operational amplifier 100, the first stage circuit 110 includes transistors MP1-MP3, MN1 and MN2. The second stage circuit 120 includes transistors MP8, MP9, MN3 and MN4. The third stage circuit 130 includes transistors MP10 and MN5. The Ahuja compensation circuit 140 includes transistors MP4-MP7 and compensation capacitors $C_C$ and $C_E$. $V_{DD}$, $V_{BP}$, $V_{BN}$, $V_{BP1}$, and $V_{BN2}$ are bias voltages for operating the operational amplifier 100. Meanwhile, the transconductance of the first stage circuit 110 contributed by the transistors MP1 and MP2 is represented by $g_{m1}$; the transconductance of the second stage circuit 120 contributed by the transistor MN3 is represented by $g_{m2}$; the transconductance of the second stage circuit 120 contributed by the transistor MN4 is represented by $g_{m21}$; the transconductance of the third stage circuit 130 contributed by the transistor MP10 is represented by $g_{m3}$; the transconductance of the Ahuja compensation circuit 140 contributed by the transistors MP6 and MP7 is represented by $g_{mc}$. In this embodiment, transistors MP1-MP10 are P-channel metal-oxide semiconductor field-effect transistors (MOSFETs), while transistors MN1-MN5 are N-channel MOSFETs. However, other types of transistors providing similar functions can also be used in other embodiments of the present invention.

In the first stage circuit 110, the four transistors MP1, MP2, MN1 and MN2 form a differential amplifier, and the transistor MP3 functions as a current source for operating the differential amplifier. Differential input voltages $I_{N-}$ and $I_{N+}$ are respectively applied to the gates of the transistors MP1 and MP2. The voltage difference $\Delta V$ between the differential input voltages $I_{N-}$ and $I_{N+}$ can thus be amplified with the gain $g_{m1}$, and then outputted at the output end of the first stage circuit 110 (the drain of the transistor MN2).

The primary compensation circuit 150 includes a resistor $R_D$ and a capacitor $C_D$. The resistor $R_D$ is coupled to the gate of the transistor MN4. The capacitor $C_D$ is coupled between the gate and the drain of the transistor MN4. At low frequencies, a voltage received at the input end of the second stage amplifier 120 (the gate of the transistor MN3) can be amplified with the gain $g_{m2}$, and then outputted at the output end of the second stage circuit 120 (the drain of the transistor MN4). At high frequencies, the transistor MN4, which is the load transistor of the second stage circuit 120, functions as a drain-gate connected transistor due to the primary compensation circuit 150. In other word, the load impedance of the second stage circuit 120 is lowered, thereby reducing the second stage circuit 120 to a wideband circuit with a low gain equal to $g_{m2}/g_{m21}$ at high frequencies. Essentially this means that the pole due to the second stage circuit 120 is moved to high frequencies and the overall three-stage operational amplifier 100 only has two significant poles, respectively contributed by the first stage circuit 110 and by the third stage circuit 130, thereby achieving more stability. However, all three stages of the operational amplifier 100 still contribute to the DC gain $A_{DC}$ represented by $g_{m1}g_{m2}g_{m3}r_{o1}r_{o2}R_L$, where $r_{o1}$ is the output resistance of the first stage circuit 110 and $r_{o2}$ is the output resistance of the second stage circuit 120.

The resistor $R_D$ and the capacitor $C_D$ in the primary compensation circuit 150, together with the load transistor MN4 of the second stage circuit 120, form an equivalent circuit coupled between the drain point of the transistor MN4 and ground. The above-mentioned equivalent circuit includes a capacitor $C_{eq}$ and a resistor $R_{eq}$ coupled in series.

$$C_{eq} = g_{m21} R_D C_D$$

$$R_{eq} = 1/g_{m21}$$

At the unity-gain frequency $\omega_0$ of the operational amplifier 100, it is required to have the impedance of the capacitor $C_{eq}$ much lower than that of the resistor $R_{eq}$. This can be achieved if $$\frac{1}{R_D C_D} \ll \omega_0$$

With small-signal analysis, the operational amplifier 100 is characterized by a transfer function having 4 poles. When the external load capacitor $C_L$ is small, the dominant pole $\omega_{p1}$ (the lowest frequency) and the unity-gain frequency $\omega_0$ can be represented by:

$$\omega_{p1} = \sqrt{\frac{1}{g_{m2}g_{m3}r_{o1}r_{o2}R_L C_C}}$$

$$\omega_0 = 2\pi f_0 = \frac{g_{m1}}{C_C}$$

However, when the external load capacitor $C_L$ is large, the dominant pole $\omega_{p1}$ is determined by the output stage. In this case, the dominant pole $\omega_{p1}$ and the unity-gain frequency $\omega_0$ can be represented by $$\omega_{p1} = \frac{1}{R_L C_L}$$

$$\omega_0 = 2\pi f_0 = \frac{g_{m1}g_{m2}g_{m3}r_{o1}r_{o2}}{C_L}$$

The non-dominant pole $\omega_{p4}$ located at the highest frequency can be represented by $g_{m21}/C_2$, where $C_2$ is the net capacitance at the output of the second stage circuit 120. The effect of the non-dominant pole $\omega_{p4}$ can usually be ignored.

The remaining non-dominant pole-pair $\omega_{p2}$ and $\omega_{p3}$ determine the effectiveness of the compensation. The damping factor $\zeta$ and the natural frequency $\omega_n$ of the non-dominant pole-pair $\omega_{p2}$ and $\omega_{p3}$ can be represented by:

$$\zeta = \frac{1}{2}\sqrt{\frac{C_1 g_{mc} g_{2l}}{C_L g_{m2} g_{m3}}}\left[1 + \frac{C_L}{C_C}\right] \quad (6)$$

$$\omega_n = \sqrt{\frac{g_{mc} g_{m2} g_{m3}}{g_{m2l} C_1 C_L}} \quad (7)$$

where $C_1$ is the net capacitance at the output of the first stage circuit 110

The damping factor $\zeta$ indicates the ability of an amplifier to resist a change in its output signal. A higher damping factor means better margin of stability. A high natural frequency $\omega_n$ means ability to drive higher capacitive loads. The effectiveness of the compensation can be evaluated by comparing the damping factor and the natural frequency of the three-stage operational amplifier 100 in the embodiment of the present invention to those of the conventional two-stage Ahuja-compensated operational amplifier 30. By comparing (4) with (6) and (5) with (7), it can be observed that in the three-stage operational amplifier 100 in the embodiment of the present invention, the damping factor $\zeta$ and the natural frequency $\omega_n$ of the non-dominant pole-pair $\omega_{p2}$ and $\omega_{p3}$ can be adjusted with more flexibility since additional parameters such as $g_{m2}$ and $g_{m21}$ are introduced. For example, setting $g_{m21}$ to $g_{m2}$ favors a high damping factor $\zeta$, while setting $g_{m21}$ to $g_{mc}$ favors a high natural frequency $\omega_n$.

In small-signal analysis, if the time constants $R_D C_D$ and $R_L C_L$ are small compared to $1/\omega_{p1}$, the transfer function of the three-stage operational amplifier 100 only has a single zero given by $\omega_{z1} = g_{mc}/C_c$. $\omega_{z1}$ is usually a non-dominant zero and thus does not appreciably affect the compensation. On the other hand, if $R_D C_D$ is small but $R_L C_L$ is large (of the same order as $1/\omega_{p1}$ or larger), the transfer function of the three-stage operational amplifier 100 has another zero given by $\omega_{z2} = 1/R_D C_D$. $\omega_{z2}$ can improve stability when driving very large capacitive loads and is of significant advantage.

The three-stage operational amplifier 100 according to the first embodiment of the present invention works well for a wide range of $C_L$ value with small values of $C_c$. For large values of $C_L$ and a small $C_c$, the damping factor $\zeta$ of the non-dominant pole-pair is desirably high, as can be seen in (6) and (7). However, for small values of $C_L$ and a small $C_c$, the damping factor $\zeta$ becomes undesirably low, causing possible instability. Therefore, the Ahuja compensation circuit 140 in the embodiment of the present invention further includes the compensation capacitor $C_E$ capable of increasing $C_1$, the overall the net capacitance at the output of the first stage circuit 110. From (6), the damping factor $\zeta$ can also be increased accordingly.

Figure 7:
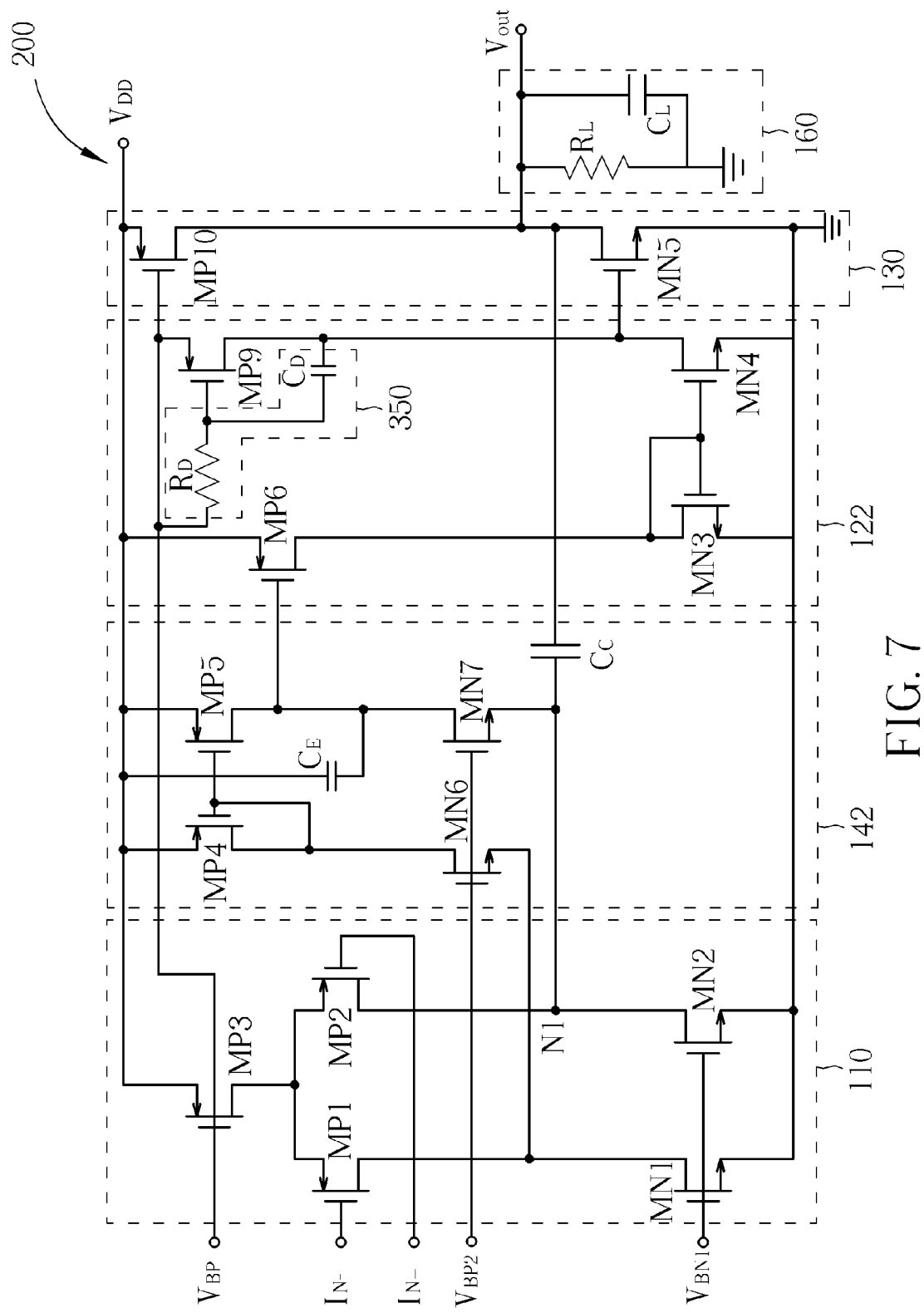
FIG. 7 is a diagram of a three-stage operational amplifier according to a second embodiment of the present invention.

Please refer to FIG. 7 for a diagram of a three-stage operational amplifier 200 according to a second embodiment of the present invention. The operational amplifier 200 includes the first stage circuit 110 and the third stage circuit 130 having similar structures as depicted in FIG. 6. The second embodiment differs from the first embodiment in that the operational amplifier 200 includes a second stage circuit 122 and an Ahuja compensation circuit 142. The Ahuja compensation circuit 142 includes NMOS transistors MN6-MN7, PMOS transistors MP4-MP5, and compensation capacitors $C_C$ and $C_E$. The compensation capacitors $C_C$ is coupled to a low impedance node (N1) of the first stage circuit 110. The second stage circuit 122 includes NMOS transistors MN3-MN4 and PMOS transistors MP8-MP9, as well as the primary compensation circuit 350 having a resistor $R_D$ and a capacitor $C_D$. The resistor $R_D$ is coupled to the gate of the transistor MP9, while the capacitor $C_D$ is coupled between the gate and the drain of the transistor MP9.

Figure 8:
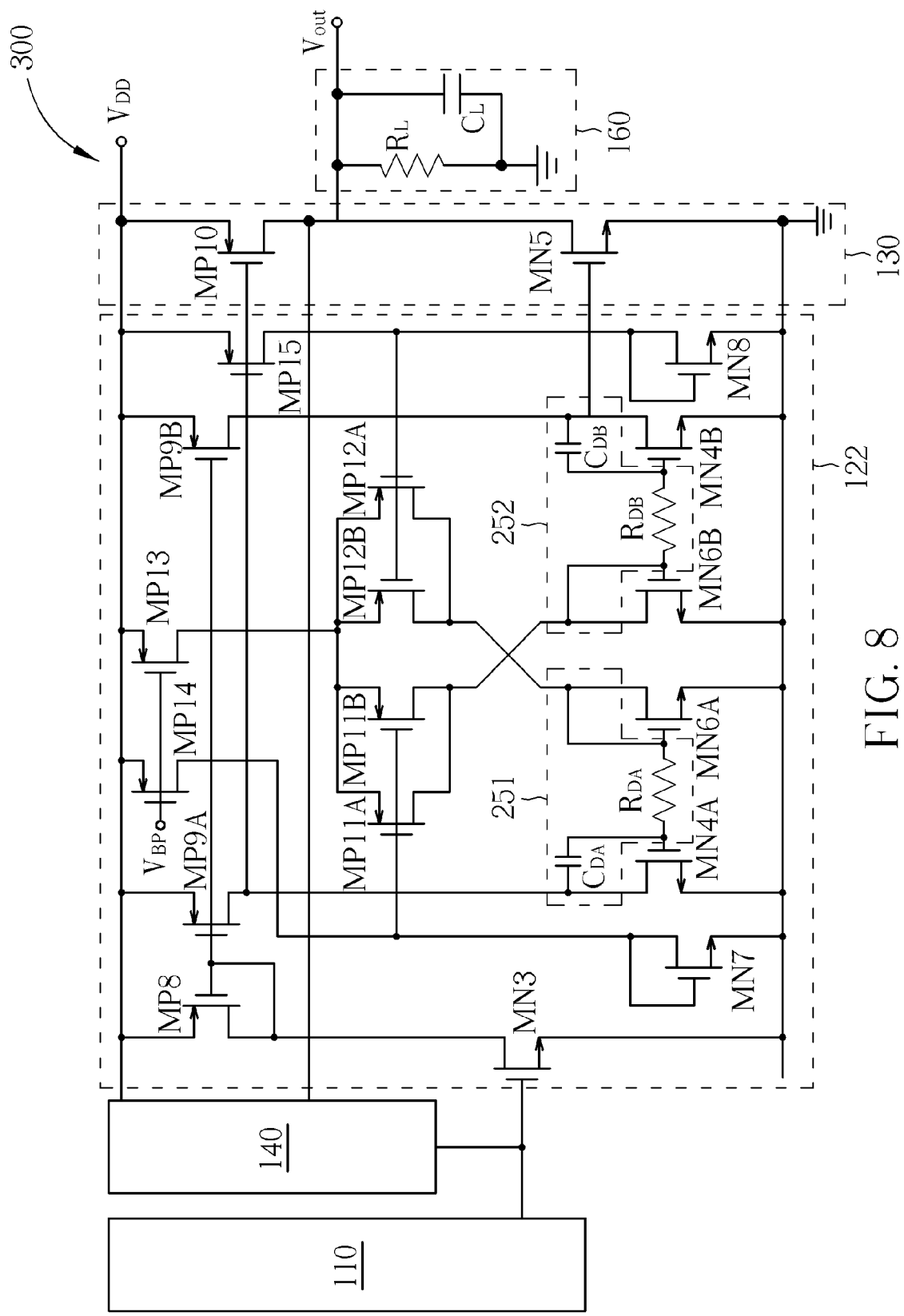
FIG. 8 is a diagram of a three-stage operational amplifier according to a third embodiment of the present invention.

Please refer to FIG. 8 for a diagram of a three-stage operational amplifier 300 according to a third embodiment of the present invention. The operational amplifier 300 includes the first stage circuit 110, the third stage circuit 130, and the Ahuja compensation circuit 140 having similar structures as depicted in FIG. 6. The second embodiment differs from the first embodiment in that the operational amplifier 300 includes a second stage circuit 122 which, as compared to the operational amplifier 100, further employs a class AB output stage configuration.

The second stage circuit 122 includes NMOS transistors MN3, MN4A, MN4B, MN6A, MN6B, MN7 and MN8, PMOS transistors MP8, MP9A, MP9B, MP11A, MP11B, MP12A, MP12B, and MP13-15, as well as a first primary compensation circuit 251 and a second primary compensation circuit 252. The first primary compensation circuit 251 includes a resistor $R_{DA}$ and a capacitor $C_{DA}$. The resistor $R_{DA}$ is coupled between the gates of the transistors MN4A and MN6A, while the capacitor $C_{DA}$ is coupled between the gate and the drain of the transistor MN4A. The second primary compensation circuit 252 includes a resistor $R_{DB}$ and a capacitor $C_{DB}$. The resistor $R_{DB}$ is coupled between the gates of the transistors MN4B and MN6B, while the capacitor $C_{DB}$ is coupled between the gate and the drain of the transistor MN4B. At low frequencies, the transconductance of the second stage circuit 122 is represented by $g_{m2}$, which is twice as large as $g_{m2}$ in the first embodiment. Other main parameters, such as $g_{m1}$, $g_{mc}$, $g_{m21}$, $C_c$, and $R_D C_D$ are of similar values as those of the first embodiment.

The class AB configuration is sometimes referred to as a "push-pull" configuration since a first branch of the output stage "pushes" or sources currents to a load while a second branch of the output stage "pulls" or sinks current from the load. Class-AB amplifiers can reduce high power consumption of a class-A amplifier by always having one output branch substantially turned off when the other output branch is turned on. Although the current in one leg of a class AB amplifier is substantially turned off there is a small amount of current flowing in that leg. The small residual current in the class AB amplifier avoids the crossover distortion produced the turning on and off of the currents in class-B amplifiers. By employing the class AB output stage scheme, the operational amplifier 200 according to the second embodiment of the present invention can achieve better power efficiency while driving heavy resistive loads.

Figure 9:
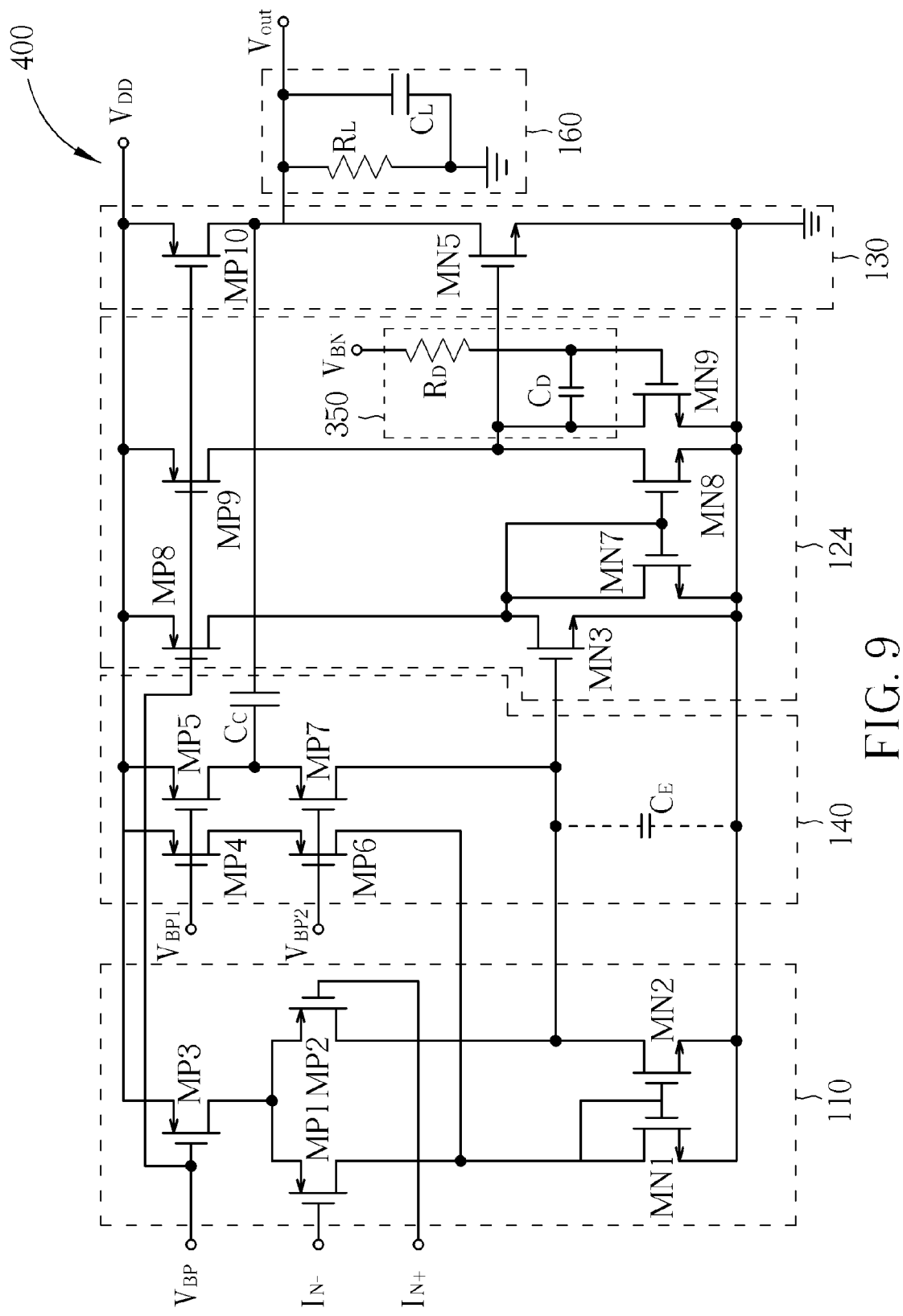
FIG. 9 is a diagram of a three-stage operational amplifier according to a fourth embodiment of the present invention.

Please refer to FIG. 9 for a diagram of a three-stage operational amplifier 400 according to a fourth embodiment of the present invention. The operational amplifier 400 includes the first stage circuit 110, the third stage circuit 130, and the Ahuja compensation circuit 140 having similar structures as depicted in FIG. 6. The fourth embodiment differs from the first embodiment in that the operational amplifier 300 includes a second stage circuit 124 which, as compared to the operational amplifier 100, further improves overall $V_{DD}$-PSRR. The second stage circuit 124, comprising NMOS transistors MN3, MN7-MN9 and PMOS transistors MP8, MP9, also includes a primary compensation circuit 350 having a resistor $R_D$ and a capacitor $C_D$. The resistor $R_D$ is coupled to the gate of the transistor MN9, while the capacitor $C_D$ is coupled between the gate and the drain of the transistor MN9.

PSRR is a measure of an operational amplifier's ability to maintain a constant output when the supply voltage varies. The value of PSRR depends on the supply being taken in account for, being so the PSRR for the higher supply voltage is different than the PSRR of the lower supply voltage. For the first embodiment of the present invention depicted in FIG. 6, the $PSRR_{VDD1}$ and $PSRR_{GND1}$ of the second stage circuit 120 in isolation can be represented by:

$$PSRR_{VDD1} = \frac{r_{o4}/r_{o3}}{A_2} \quad (8)$$

$$PSRR_{GND1} = \frac{r_{o3} - r_{o4}}{A_2 r_{o3}} \quad (9)$$

where $r_{o3}$ is the small signal drain resistance of transistor MN3;

$r_{o4}$ is the small signal drain resistance of transistor MN4; and

A2 is the DC gain of the second stage circuit 120

Similarly, for the fourth embodiment of the present invention depicted in FIG. 9, the $PSRR_{VDD4}$ and $PSRR_{GND4}$ of the second stage circuit 124 in isolation can be represented by:

$$PSRR_{VDD4} = \frac{(r_{o8} - r_{o9})r_{o5}}{A_2(r_{o5} + r_{o9})r_{o8}} \quad (10)$$

$$PSRR_{GND4} = \frac{(r_{o8} + r_{59})r_{o9}}{A_2(r_{o5} + r_{o9})r_{o8}} \quad (11)$$

where $r_{o8}$ is the small signal drain resistance of the transistor MP8;

$r_{o9}$ is the small signal drain resistance of the transistor MP9;

$r_{o5}$ is the small signal drain resistance of the transistors MN8 and MN9 coupled in parallel; and A2 is the DC gain of the second stage circuit 124

From (8) and (10), the second stage circuit 124 can have a better (lower) $V_{DD}$-PSRR since the numerator of $PSRR_{VDD4}$ can be adjusted to zero, which happens when the disturbance current transmitted through the transistor MP9 (after being mirrored and phase-inverted by the transistor MN7) matches the disturbance current transmitted through the transistor MP8 (after being mirrored and phase-inverted by the transistor MN8).

Accordingly, the embodiments of the present invention provide a three-stage operational amplifier capable of functioning as a two-stage operational amplifier at high frequencies, as well as driving large capacitive loads with low power consumption.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A three-stage frequency-compensated operational amplifier for driving large capacitive loads, comprising:
   a first-stage circuit for generating a first output signal by amplifying an input signal, comprising:
      an input end for receiving the input signal; and
      an output end for outputting the first output signal;
   a second-stage circuit for generating a second output signal by selectively amplifying the first output signal with a first gain while the first output signal is at a first frequency and amplifying the first output signal with a second gain while the first output signal is at a second frequency, comprising:
      an input end coupled to the output end of the first-stage circuit for receiving the first output signal;
      an output end for outputting the second output signal;
      a bias node which is different from the input end of the second-stage circuit; and
      a first compensation circuit coupled between the output end and the bias node for modifying the first gain to the second gain at the second frequency;
   a third-stage circuit for generating a third output signal by amplifying the second output signal, comprising:
      an input end for receiving the second output signal; and
      an output end for outputting the third output signal; and
   a second compensation circuit for adjusting frequency characteristics of the second and third-stage circuits, the second compensation circuit comprising:
      a first compensation capacitor coupled to the output end of the third-stage circuit.

2. The operational amplifier of claim 1 wherein the first-stage circuit includes a differential amplifier having first, second, third and fourth transistors.

3. The operational amplifier of claim 2 further comprising a current source for communicating with the differential amplifier.

4. The operational amplifier of claim 1 wherein:
   the second-stage circuit further comprises:
      a first transistor providing the first gain and including:
         a control end coupled to the input end of the second-stage circuit;
         a first end; and
         a second end;
      a second transistor providing a third gain and including:
         a control end;
         a first end coupled to the first end of the first transistor; and
         a second end coupled to the output end of the second-stage circuit; and
   the first compensation circuit comprises:
      a compensation resistor coupled between the control end of the second transistor and the bias node; and
      a compensation capacitor coupled between the control end and the second end of the second transistor for short-circuiting the control end and the second end of the second transistor at high frequencies, thereby providing the second gain equal to the first gain divided by the third gain.

5. The operational amplifier of claim 4 wherein the second-stage circuit further comprises:
   a third transistor coupled to the second end of the first transistor for providing a bias current; and
   a fourth transistor coupled to the second end of the second transistor for providing a bias current.

6. The operational amplifier of claim 1 wherein:
   the second-stage circuit further comprises:
      a first transistor providing the first gain and including:
         a control end coupled to the input end of the second-stage circuit;
         a first end; and
         a second end;
      a second transistor providing a third gain and including:
         a control end;
         a first end coupled to the first end of the first transistor; and
         a second end coupled to the output end of the second-stage circuit;
      a third transistor including:
         a control end coupled to the second end of the first transistor;

a first end coupled to the first end of the first transistor; and
a second end coupled to the second end of the first transistor;
a fourth transistor including:
a control end coupled to the second end of the first transistor;
a first end coupled to the first end of the first transistor; and
a second end coupled to the output end of the second-stage circuit; and
the first compensation circuit comprises:
a compensation resistor coupled between the control end of the second transistor and the bias node; and
a compensation capacitor coupled between the control end and the second end of the second transistor for short-circuiting the control end and the second end of the second transistor at high frequencies, thereby providing the second gain equal to the first gain divided by the third gain.

7. The operational amplifier of claim 6 wherein the second-stage circuit further comprises:
a fifth transistor coupled to the second end of the first transistor for providing a bias current; and
a sixth transistor coupled to the second end of the second transistor for providing a bias current.

8. The operational amplifier of claim 1 wherein
the second-stage circuit further comprises:
a first transistor including:
a control end coupled to the input end of the second-stage circuit;
a first end; and
a second end;
a second transistor including:
a control end;
a first end coupled to the first end of the first transistor; and
a second end coupled to the control end of the second transistor;
a third transistor including:
a control end;
a first end coupled to the first end of the first transistor; and
a second end coupled to the control end of the third transistor; and
a class AB configuration circuit including:
a fourth transistor including:
a control end;
a first end coupled to the first end of the first transistor; and
a second end;
a fifth transistor including:
a control end;
a first end coupled to the first end of the first transistor; and
a second end coupled to the control end of the fifth transistor;
a sixth transistor including:
a control end;
a first end coupled to the first end of the first transistor; and
a second end coupled to the output end of the second-stage circuit;
a seventh transistor including:
a control end;
a first end coupled to the first end of the first transistor; and
a second end coupled to the control end of the seventh transistor; and
the first compensation circuit comprises:
a first compensation resistor coupled between the control ends of the fourth and fifth transistors;
a second compensation resistor coupled between the control ends of the sixth and seventh transistors;
a first compensation capacitor coupled between the control end and the second end of the fourth transistor; and
a second compensation capacitor coupled between the control end and the second end of the sixth transistor.

9. The operational amplifier of claim 8 wherein the second-stage circuit further comprises a plurality of eighth transistors each coupled to corresponding first through seventh transistors for providing bias current.

10. The operational amplifier of claim 1 wherein the third-stage circuit further comprises:
a first transistor including:
a control end coupled to the input end of the third-stage circuit;
a first end; and
a second end coupled to the output end of the third-stage circuit; and
a second transistor including:
a control end;
a first end; and
a second end coupled to the output end of the third-stage circuit.

11. The operational amplifier of claim 1 wherein the second compensation circuit further comprises a second compensation capacitor coupled to the input end of the second-stage circuit.

12. The operational amplifier of claim 1 further comprising a plurality of voltage sources for providing a plurality of bias voltages.

13. A three-stage frequency-compensated operational amplifier for driving large capacitive loads, comprising:
a first-stage circuit for generating a first output signal by amplifying an input signal, comprising:
an input end for receiving the input signal;
a low impedance end; and
an output end for outputting the first output signal, wherein the output end is different from the low impedance end of the first-stage circuit;
a second-stage circuit for generating a second output signal by selectively amplifying the first output signal with a first gain while the first output signal is at a first frequency and amplifying the first output signal with a second gain while the first output signal is at a second frequency, comprising:
an input end coupled to the output end of the first-stage circuit for receiving the first output signal;
an output end for outputting the second output signal; and
a first compensation circuit for modifying the first gain to the second gain at the second frequency;
a third-stage circuit for generating a third output signal by amplifying the second output signal, comprising:
an input end for receiving the second output signal; and
an output end for outputting the third output signal; and
a first compensation capacitor coupled between the low impedance end of the first-stage circuit and the output end of the third-stage circuit for adjusting frequency characteristics of the second and third-stage circuits.

14. The operational amplifier of claim 13 wherein the first-stage circuit includes a differential amplifier having first, second, third and fourth transistors.

15. The operational amplifier of claim 14 further comprising a current source for communicating with the differential amplifier.

16. The operational amplifier of claim 13 wherein:
the second-stage circuit further comprises:
a first transistor providing the first gain and including:
a control end coupled to the input end of the second-stage circuit;
a first end; and
a second end;
a second transistor providing a third gain and including:
a control end;
a first end coupled to the first end of the first transistor; and
a second end coupled to the output end of the second-stage circuit; and
the first compensation circuit comprises:
a compensation resistor coupled to the control end of the second transistor; and
a compensation capacitor coupled between the control end and the second end of the second transistor for short-circuiting the control end and the second end of the second transistor at high frequencies, thereby providing the second gain equal to the first gain divided by the third gain.

17. The operational amplifier of claim 16 wherein the second-stage circuit further comprises:
a third transistor coupled to the second end of the first transistor for providing a bias current; and
a fourth transistor coupled to the second end of the second transistor for providing a bias current.

18. The operational amplifier of claim 13 wherein the third-stage circuit further comprises:
a first transistor including:
a control end coupled to the input end of the third-stage circuit;
a first end; and
a second end coupled to the output end of the third-stage circuit; and
a second transistor including:
a control end;
a first end; and
a second end coupled to the output end of the third-stage circuit.

19. The operational amplifier of claim 13 further comprising a second compensation capacitor coupled to the input end of the second-stage circuit.

20. The operational amplifier of claim 13 further comprising a plurality of voltage sources for providing a plurality of bias voltages.

* * * * *